United States Patent
Sun et al.

(10) Patent No.: US 10,256,600 B2
(45) Date of Patent: Apr. 9, 2019

(54) HYBRID PHOTONIC PLASMONIC INTERCONNECTS (HYPPI) WITH INTRINSIC AND EXTRINSIC MODULATION OPTIONS

(71) Applicant: The George Washington University, Washington, DC (US)

(72) Inventors: Shuai Sun, Vienna, VA (US); Volker J. Sorger, Alexandria, VA (US); Tarek El-Ghazawi, Vienna, VA (US); Vikram K. Narayana, Ashburn, VA (US); Abdel-Hameed A. Badawy, Little Rock, AR (US)

(73) Assignee: The George Washington University, Washington, DC (US)

( * ) Notice: Subject to any disclaimer, the term of this patent is extended or adjusted under 35 U.S.C. 154(b) by 389 days.

(21) Appl. No.: 15/194,119

(22) Filed: Jun. 27, 2016

(65) Prior Publication Data

US 2017/0302053 A1 Oct. 19, 2017

Related U.S. Application Data

(60) Provisional application No. 62/387,218, filed on Dec. 24, 2015, provisional application No. 62/387,143, filed on Dec. 23, 2015.

(51) Int. Cl.
*H01S 5/00* (2006.01)
*H01S 5/10* (2006.01)
(Continued)

(52) U.S. Cl.
CPC ........ *H01S 5/0014* (2013.01); *G02B 6/12004* (2013.01); *H01S 5/0427* (2013.01);
(Continued)

(58) Field of Classification Search
CPC ............................ H01S 5/0014; H01S 5/0427
(Continued)

(56) References Cited

PUBLICATIONS

Babicheva, et a., Towards CMOS-compatible Nanophotonics Ultra-Compact Modulators Using Alternative Plasmonic Materials, Optics Express, 2013, 21:22:27326-27337.
(Continued)

*Primary Examiner* — David Porta
*Assistant Examiner* — Meenakshi Sahu
(74) *Attorney, Agent, or Firm* — Blank Rome LLP

(57) ABSTRACT

The Hybrid Photonic Plasmonic Interconnect (HyPPI) combines both low loss photonic signal propagation and passive routing with ultra-compact plasmonic devices. These optical interconnects therefore uniquely combine fast operational data-bandwidths (in hundreds of Gbps) for light manipulation with low optical attenuation losses by hybridizing low loss photonics with strong light-matter-interaction plasmonics to create, modulate, switch and detect light efficiently at the same time. Initial implementations were considered for on-chip photonic integration, but also promising for free space or fiber-based systems. In general two technical options exist, which distinguished by the method the electric-optic conversion is executed: the extrinsic modulation method consists of an continuous wave source such as an LED or laser operating at steady power output, and signal encoding is done via an electro-optic modulator downstream of the source in the interconnect. In contrast, in the intrinsic method, the optical source is directly amplitude modulated.

25 Claims, 4 Drawing Sheets

(51) Int. Cl.
    *H01S 5/042* (2006.01)
    *G02B 6/12* (2006.01)
(52) U.S. Cl.
    CPC .. *H01S 5/1046* (2013.01); *G02B 2006/12121* (2013.01); *G02B 2006/12123* (2013.01)
(58) Field of Classification Search
    USPC ..................................................... 250/338.1
    See application file for complete search history.

(56) References Cited

PUBLICATIONS

Babicheva, et al., Plasmonic Finite-Thickness Metal-SemiConductor-Metal Waveguide as Ultra-Compact Modulator, 10 pages.
Babicheva, et al., Plasmonic Modulator Optimized by Patterning of Active Layer and Tuning Permittivity, 11 pages.
Babicheva, et al., Plasmonic Modulator Using CMOS-Compatible Material Platform, IEEE, 2014, 28-30.
Batten, et al., Building Manycore Processor-to-DRAM Networks with Monolithic CMOS Silicon Photonics, as accepted for Publication, 9 pages.
Beling, et al., Miniaturized Waveguide-Integrated p-i-n Photodetector With 120-GHz Bandwidth and High Responsivity, IEEE Photonics Technology Letters, 2005, 17:10:2152-2154.
Berini, et al., Surface Plasmon-polariton Amplifiers and Lasers, Nature Photonics, 2012, 6:16-24.
Borkar PowerPoint Entitled NoCs: What's the Point? 16 pages.
Cai, et al., Compact, High-Speed and Power-Efficient Electrooptic Plasmonic Modulators, Nano Letters, 2009, 9:12:4403-4411.
Casalino, et al., Asymmetric MSM Sub-bandgap All-Silicon Photodetector With Low Dark Current, 2013, 21:23:28072-28082.
Chen, et al., Predictions of CMOS Compatible On-chip Optical Interconnect, 2005, 8 pages.
Dionne, et al., PlasMOStor: A Metal-Oxide-Si Field Effect Plasmonic Modulator, Nano Letters, 2009, 9:2:897-902.
Dong, et al., Low Vpp, Ultralow-energy, Compact, High-Speed Silicon Electro-Optic Modulator, 2009, 17:25:22484-22490.
Duan, et al., 310 GHz Gain-bandwidth Product Ge—Si Avalanche Photodetector for 1550 nm Ligh Detection, Optics Express, 2012, 20:10:11031-11036.
Engel, et al., Black Phosphorus Photodetector for Multispectral, High-Resolution Imaging, Nano Letters, 2014, 14:6414-6417.
Fan, et al., An Invisible Metal-Semiconductor Photodetector, Nature Photonics, 2012, 6:380-385.
Fang, et al., Graphene-Antenna Sandwich Photodetector, Nano Letters, 2012, 12:3808-3813.
Feng, et al., High-Speed Ge Photodetector Monolithically Integrated with Large Cross-section Silicon-on-insulator Waveguide, Applied Physics Letters, 2009, 95, 4 pages.
Furchi, et al., Microcavity-Integrated Graphene Photodetector, Nano Letters, 2012, 12:2773-2777.
Gan, et al., Chip-Integrated Ultrafast Graphene Photodetector With high Responsivity, Nature Photonics, 2013, 7:883-887.
Gao, et al., High-Contrast Terahertz Wave Modulation by Gated Graphene Enhanced by Extraordinary Transmission Through Ring Apertures, Nano Letters, 2014, 14:1242-1248.
Gao, et al., High-speed Eletro-optic Modulator Integrated with Graphene-Boron Nitride Heterostructure and Photonic Crystal Nanocavity, ACS Publications, 2015, 15:2001-2005.
Gardes, et al., 40 Gb/s Silicon Photonics Modulator for TE and TM Polarisations, 2011, 19:12:11804-11814.
Haffner, et al., All-plasmonic Mach-Zehnder Modulator Enabling Optic High-Speed Communication at the Microscale, Letters, 2015, 9:525-529.
Hemenway, Roadmap for Board Level Optical Interconnects—They're Coming Sooner PowerPoint slides 2013, 10 pages.

Hu, et al., An Optimized Ultraviolet—A Light Photodetector with Wide-Range Photoresponse Based on Zns/ZnO Biaxial Nanobelt, Advance Materials, 2012, 24:2305-2309.
International Technology Roadmap for Semiconductors 2013 Edition, Micro-Electro-Mechanical Systems (MEMS), 36 pages.
Kato, et al., A High-Efficiency 50 GHz InGaAs Multimode Waveguide Photodetector, IEEE Journal of Quantum Electronics, 1992, 28:12:2728-2735.
Kim et al., Graphene-based Plasmonic Photodetector for Photonic Integrated Circuits, Optics Express, 2014, 22:1:803-808.
Koos, et al., Silicon-Organic Hybrid (SOH) and Plasmonic-Organic Hybrid (POH) Intergration, Journal of Lightwave Technology, 2016, 34:2:256-268.
Krasavin, et al., All-Plasmonic Modulation via Stimulated Emission of Copropagating Surface Plasmon Polaritons on a Substrate with Gain, Nano Letters, 2011, 11:2231-2235.
Krasavin, et al., Photonic Signal Processing on Electronic Scales: Electro-Optical Field-Effect Nanoplasmonic Modulator, Physical Review Letters, 2012, 5 pages.
Laros, et al., Energy-Efficient High Performance Computing Measurement and Tuning, 2013, 73 pages.
Lau, et al., Enhanced Modulation Bandwidth of Nanocavity Light Emitting Devices, 2009, 17:10:7790-7799.
Li, et al., 40 Gb/s All-Silicon Photodetector Based on Micro ring Resonators, IEEE Photonics Technology Letters, 2015, 27:7:729-732.
Li, et al., Ultralow-loss, High-Density SOI Optical Waveguide Routing for Marcochip Interconnects, Optics Express, 2012, 20:11:12035-12039.
Littlejohns, et al., 50 Gb/s Silicon Photonics Receiver With Low Insertion Loss, IEEE Photonics Technology Letters, 2014, 26:7:714-717.
Liu, et al., Integrated Nano-Cavity Plasmon Light-Sources for On-chip Optical Interconnects, ACS Publications, 2016, 33 pages.
Liu, et al., Plasmon Resonance Enhanced Multicolour Photodetection by Graphene, Nature Communiocations, 2011, 7 pages.
Ma, et al., Room-Temperature Sub-Diffraction-Limited Plasmon Lased by Totalk Internal Reflection, Nature Materials, 2011, 10:110-113.
McNerney, et al., Role of Design Complexity in Technology Improvement, 2011, 108:22:9008-9013.
Melikyan, et al., High-Speed Plasmonic Phase Modulators, Nature Photonics, 2014, 8:229-233.
Melikyan, et al., Surface Plasmon Polariton Absorpotion Modulator, 2011, 19:9:8855-8869.
Miller, Device Requirements for Optical Interconnects to Silicon Chips, Proceedings of the IEEE, 2009, 97:7:1166-1185.
Mousavi, et al., Plasmonic Photodetector with Terahertz Electrical Bandwidth, Appl. Phys. Lett. 2014, 104, 4 pages.
Neira, et al., Ultrafast All-Optical Modulation with Hyperbolic Metamaterial Integrated in Si Photonic Circuitry, Optics Express, 2014, 22:9:10987-10994.
Novack, et al., Germanium Photodetector with 60 GHz Bandwidth Using Inductive Gain Peaking, Optics Express, 2013, 21:23:28387-28393.
Piao, et al., Control of Fano Asymmetry in Plasmon Induced Transparency and its Application to Plasmonic Waveguide Modulator, Optics Express, 2012, 20:17:18994-18999.
Pospischil, et al., CMOS-compatible Graphene Photodetector Covering All Optical Communication Bands, Nature Photonics, 2013, 7:892-896.
Rakheja, et al., Comparison of Electrical, Optical and Plasmonic On-Chip Interconnects Based on Delay and Energy Considerations, 13th Int'l Symposium on Quality Electronic Design, 2012, 732-735.
Schuller, et al., Plasmonics for Extreme Light Concentration and Manipulation, Nature Materials, 2010, 9:193-205.
Shackleford, et al., Integrated Plasmonic Lens Photodetector, Appl. Phys. Lett., 2009, 94, 4 pages.
Shih, Small and Fast Plasmonic Modulator, Nature Photonics, 2014, 8:171-172.
Song, et al., High-density Waveguide Superlattices With Low Crosstalk, Nature Communications, 2015, 9 pages.

(56) References Cited

PUBLICATIONS

Sorger, et al., Ultra-Compact Silicon Nanophotonic Modulator With Broadband Response, Nanophotonics, 2012, 17-22.

Sun, et al., DSENT—A Tool Connecting Emerging Photonics with Electronics for Opto-Electronic Networks-on-Chip Modeling, IEEE Computer Society, 2012, 201-210.

Thomas, et al., Plasmonic Modulators for Near-Infrared Photonics on a Silocon-on-Insulator Platform, IEEE Journal of Selected Topics in Quantum Electronics, 2013, 19:3, 8 pages.

Thomson, et al., 5-Gb/s Silicon Optical Modulator, IEEE Photonics Technology Letters, 2012, 24:4:234-236.

Timurdogan, et al., An Ultralow Power Athermal Silicon Modulator, Nature Communications, 2014, 1-11.

Ujaldon PowerPoint Entitled A Look Ahead: Echelon, 17 pages.

Vivien, et al., 42 GHz p.i.n. Germanium Photodetector Integrated in a Silicon-on-insulator Waveguide, Optics Express, 2009, 17:8:6252-6257.

Vivien, et al., Zero-bias 40Gbit/s Germanium Waveguide Photodetector on Silicon, Optics Express, 2012, 20:2:1096-1101.

Watts, et al., Low-voltage, Compact, Depletion-Mode, Silicon Mach-Zehnder Modulator, IEEE Journal of Selected Topics in Quantum Electronics, 2010, 16:1:159-164.

Watts, et al., Ultralow Power Silicon Microdisk Modulators and Switches, IEEE, 2008, 4-6.

Watts, et al., Vertical Junction Silicon Microdisk Modulators and Switches, Optics Express, 2011, 19:22:21989-22003.

Wu, et al,. Plasmonic Enhanced Quantum Well Infrared Photodetector with High Detectivity, Appl. Phys. Lett., 2010, 96, 4 pages.

Xia, et al., Ultrafast Graphene Photodetector, Nature Technology, 2009, 4:839-843.

Ye, et al., λ-Size ITO and Graphene-Based Electro-Optic Modulators on SOI, IEEE, 2014, 10 pages.

Zhang, et al., Broadband High Photoresponse from Pure Monolayer Graphene Photodetector, Nature Communications, 2012, 11 pages.

Zheng, et al., A High-speed, Turnable Silicon Photonic Ring Modulator Integrated with Ultra-Efficient Active Wavelength Control, Optics Express, 2014, 22:10:12628-12633.

Zhu, et al., Phase Modulation in Horizonital Metal-Insulator-Silicon-Insulator-Metal Plasmonic Waveguides, Optics Express, 2013, 21:7:8320-8330.

Zhu, et al., Theoretical Investigation of Silicon MOS-type Plasmonic Slot Waveguide Based MZI Modulators, Optics Express, 2010, 18:26:27802-27819.

Zortman, et al., Low-Power High-Speed Silicon Microdisk Modulators, IEEE, 2010, 2 pages.

Zortman, et al., Low-voltage Differentially-Signaled Modulators, Optics Express, 2011, 19:17:26017-26026.

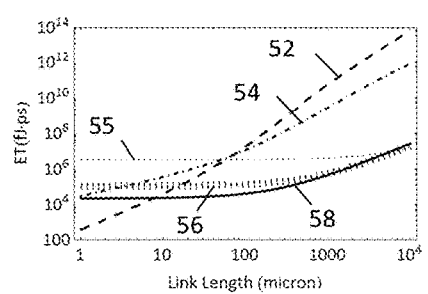
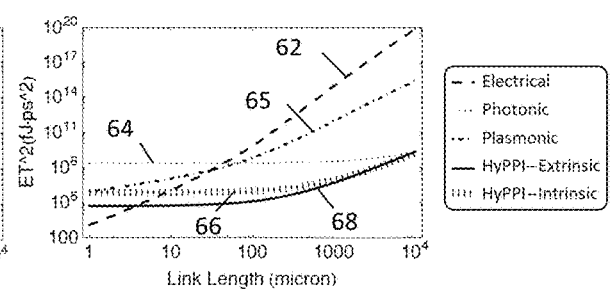
FIGURE 5(a)      FIGURE 5(b)
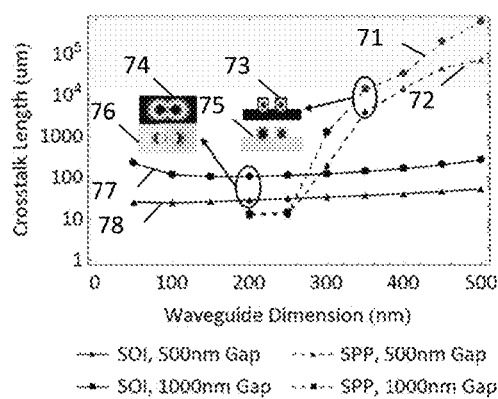
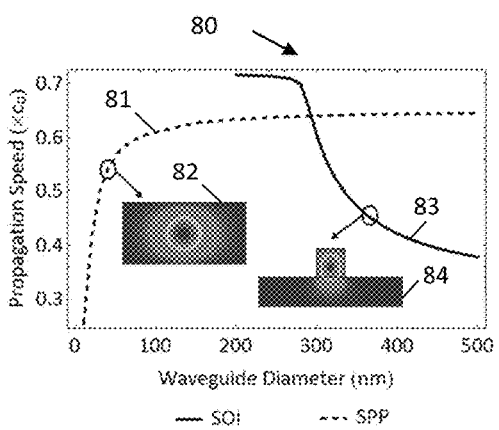
FIGURE 6(a)      FIGURE 6(b)

FIGURE 7(a) FIGURE 7(b)
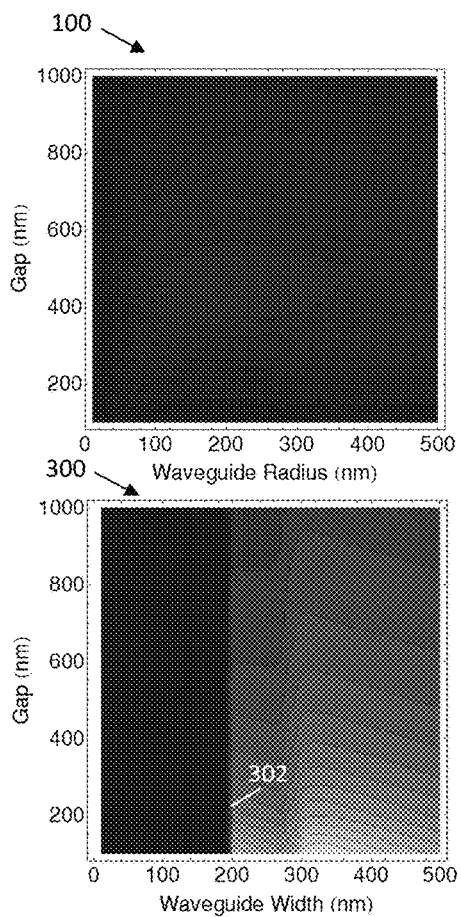
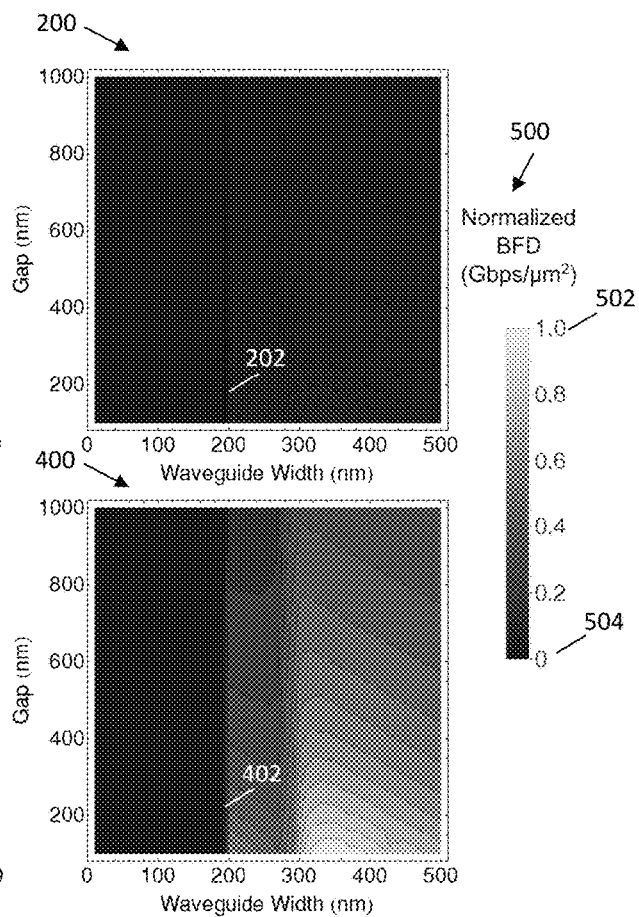
FIGURE 7(c) FIGURE 7(d)

HYBRID PHOTONIC PLASMONIC INTERCONNECTS (HYPPI) WITH INTRINSIC AND EXTRINSIC MODULATION OPTIONS

RELATED APPLICATIONS

This application claims the benefit to U.S. Provisional Application No. 62/387,218, filed Dec. 24, 2015 and U.S. Provisional Application No. 62/387,143, filed Dec. 23, 2015, of which their entities are incorporated herein by reference.

GOVERNMENT LICENSE RIGHTS

This invention was made with Government support under Grant/Contract No. FA9550-15-1-0447 awarded by Air Force Office of Scientific Research (AFOSR). The U.S. Government has certain rights in this invention.

BACKGROUND OF THE INVENTION

Field of the Invention

The present invention relates to a photonic silicon-based waveguide with plasmonic-integrated devices hybridization for high speed, energy efficiency and small footprint on-chip interconnects in the field of optical communication and data processing. Moreover, such interconnect is able to be applied for both intra-chip and inter-chip interconnects.

Background of the Related Art

The requirement of electronic device down-scaling has led to severe limitations for on-chip communication interconnects [1-3]. Likewise, the available bandwidth per compute operation (e.g. Mbps/FLOPS) continues to drop and will likely reach its end at 5 nm technology node according to the 2013 ITRS [4]. The increasing demand for data movement, requires novel interconnect technologies over classical electronic links, particularly in terms of latency, energy efficiency and integration. These effects are due to the heat generation in current integrated circuits, which can easily melt the chip. Furthermore, the physical properties of semiconductor material will no longer stay the same once we reach 5 nm feature size.

Photonic interconnects are considered a viable on-chip option since the mid-2000s ITRS roadmap for ICs due to their ability to provide higher bandwidth compared to electrical interconnects. This originates from the parallelism of bosons, which is exploited in Wavelength Division Multiplexing (WDM).

In particular, the low optical attenuation of photonics enables on-chip communications with small power losses. Active optoelectronic devices based on pure photonic elements, however, often rely on optical non-linear physical effects requiring some form of light-matter-interaction (LMI), which is inherently weak, which often leads to significant power consumption. For instance, Batten et al. [5, 6] estimated that about 40% of the total consumption is accounted for tuning the electro-optic modulator, a value that is expected to increase further at lower link utilization rates. Moreover, the sensitive ring-modulator based on high quality factor (Q factor) microrings is photon lifetime limited and bandwidth limited and requires heating to be tuned, which results in challenging dense integration.

The physical reason for the large required footprints and high-energy efficiency of active photonic devices stems from the large difference of the dipole momentum between the electronic wave function and a telecommunication photon. This leads to weak LMI, which can fundamentally be enhanced by either increasing the optical density of states, or increasing the field density overlapping with the active material. The latter is deployed, for instance, in the field of plasmonics and metal optics.

A plasmonic interconnect utilizing surface plasmon polaritons (SPPs) allows for diffraction-limited optical modes and high field densities. This enables addressing the footprint challenge of photonics by providing enhanced LMIs that allow the desired functionality (e.g. modulation, signal switching, etc.) to be realized within a small and potentially wavelength-scale device footprint. Nonetheless, plasmonic interconnects are only suitable for short-distance communication purposes since its maximum propagation length is limited to tens of micrometers due to the ohmic loss of the plasmonic coherent electron oscillations at telecommunication frequencies.

Therefore, it requires a novel interconnect option that is able to combine photonic interconnects with long propagation range with ultra-fast modulation speed plasmonic interconnects; while overcoming the high ohmic losses of the plasmonic coherent electron oscillations at telecommunication frequencies.

SUMMARY OF THE INVENTION

In light of these and other challenges, the present invention provides a Hybrid Photonic Plasmonic Interconnects (hereinafter referred to as "HyPPI") strategy to combine photonics with plasmonic interconnect technology and show that this combination leads to superior link performance. In particular, the HyPPI includes four major parts, which are 1) nano-cavity plasmon lasers/LEDs with high operating frequencies and smaller footprints comparing with other regular lasers; 2) hybrid plasmon polaritons (HPPs) based electro-optic modulator (EOM) with relatively low insertion loss and impedance mismatch; 3) plasmonic photodetector with small footprint and relatively high responsivity and response speed; 4) silicon-based photonic waveguide with propagation loss less than 1 dB/cm, while its dimension based on the bit flow density (BFD) for specific applications.

The HyPPI technology is to hybridize the diffraction-limited photonic backbones with high LMI plasmonic active devices. However, hybrid plasmon polaritons have been used to overcome the high loss of traditional surface plasmon polaritons (SPPs) by using a silicon substrate under the active materials (i.e. indium-tin-oxide) to support part of the mode in the photonic waveguide and therefore decrease the coupling mismatch dramatically. Therefore, a single TE/TM mode light generated from the light source will propagate through the photonic waveguide, being coupled and modulated by the HPP EOM and couples back to the waveguide and finally being detected by the photodiode.

While this hybridization concept is, in general, applicable to a variety of on-chip platforms, a few examples of particular chip platforms are envisioned to be early adopters for hybridization. In terms of photonics, these are silicon on insulator (SOI) waveguiding platforms such as those known in silicone photonics. In addition, III-V semiconductor based platforms, such as InP, could similarly benefit from this hybridization. Regarding plasmonics technologies, the both slot-waveguides, dielectrically-loaded surface plasmons, or hybrid-plasmon-polariton could be used.

In addition, the high operating speed light source eliminates the need for an electro-optic modulator (EOM) if it is powerful enough to drive the entire link with high operating frequency under certain circumstances. This direct light source modulation is referred to as being "intrinsic" (vs. "extrinsic" for the EOM use), which allows source power management. Hybridization of classical photonic and nanophotonic elements is energy efficient (~20 fJ/bit), low latency (<10 ps for millimeter-range propagation distances), reasonably long-range transmission (~3 dB loss per length>104 μm) interconnect and a bit flow density up to 0.5 Gbps/μm2.

Thus, the Hybrid Photonic Plasmonic Interconnect (HyPPI) combines both low loss photonic signal propagation and passive routing with ultra-compact plasmonic devices. These optical interconnects therefore uniquely combine fast operational data-bandwidths (e.g. in giga bits per second) for light manipulation with low optical attenuation losses by hybridizing low loss photonics with strong light-matter-interaction nanophotonic solutions such as found in plasmonics. Initial implementations were considered for on-chip photonic integration, it is perceivable to also combine such hybridizations with free space or fiber-based systems. In general two technical options exist, which we can distinguish by the method the electric-optic (EO) conversion is executed: the extrinsic modulation method consists of an continuous wave (cw) source such as an LED or laser operating at steady power output, and signal encoding is done via an electro-optic modulator downstream of the source in the interconnect. In contrast, in the intrinsic method, the optical source is directly amplitude modulated. This can be achieved technologically by multiple methods such as optical, electrical carrier modulation, or loss tuning.

These and other objects of the invention, as well as many of the intended advantages thereof, will become more readily apparent when reference is made to the following description, taken in conjunction with the accompanying drawings.

BRIEF DESCRIPTION OF THE FIGURES

FIG. 2(*a*) shows an extrinsic modulation 100 that uses an external electro-optic modulator (EOM, 120) and FIG. 2(*b*) shows an intrinsic modulation 200 that uses a high-speed electrical driver 212 to pump the light source 210 directly. The performance for both methods are combined in the bottom left area (110) of FIG. 1.

FIGS. 5(*a*), 5(*b*) are charts that show the composite performance metrics: a) Energy Delay Product (100) and b) Energy Delay Squared Product (200) for each interconnect.

FIG. 6(*a*) is a chart that shows 25% crosstalk coupling length (100) which is defined as the energy mount leaks from one waveguide to its adjacent waveguides. The wavelength λ=1550 nm is used as light source signal and the waveguide diameters for each curve are directly labeled on the figure. The shaded area is beyond 1 cm chip size.

FIG. 6(*b*) is a chart that shows Propagation Speed (200) of two kinds of waveguide with 1550 nm wavelength light source.

FIGS. 7(*a*)-7(*d*) illustrates bit flow density for four different kinds of interconnects (100, 200, 300, 400) as a contour plot with grey color scheme (500), in which more white (502)/black (504) indicates higher/lower bit flow density. FIG. 7(*a*) shows plasmonic interconnects (with PlasMOStor modulator). FIG. 7(*b*) shows photonic interconnects (with ring modulator). FIG. 7(*c*) shows HyPPI extrinsic modulation interconnects (with ITO modulator). FIG. 7(*d*) shows HyPPI intrinsic modulation interconnects (with nano-cavity plasmon laser). Plasmonic waveguide has metal embedded structure with Ag cylinder inside the dielectric. Others are using normal SOI waveguide with silicon strips over silicon oxide base and have diffractive limit below 200 nm waveguide width (202, 302, 402).

DETAILED DESCRIPTION OF THE PREFERRED EMBODIMENTS

Figure 1:
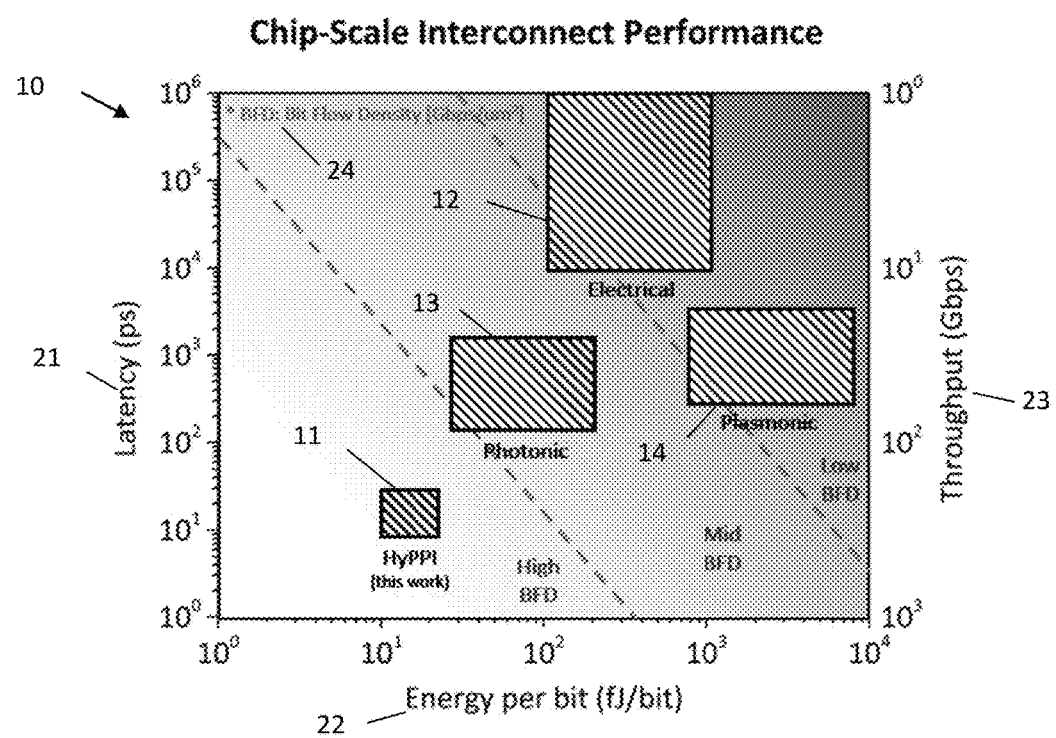
FIG. 1 is a top view 100 of the performance of the proposed invention 110 comparing with other interconnect technology options (electrical 120, photonic 130 and plasmonic 140 interconnects). The compared performance figure of merit are interconnect latency 210, energy efficiency 220, link throughput 230 and bit flow density 240.

In describing a preferred embodiment of the invention illustrated in the drawings, specific terminology will be resorted to for the sake of clarity. However, the invention is not intended to be limited to the specific terms so selected, and it is to be understood that each specific term includes all technical equivalents that operate in similar manner to accomplish a similar purpose. Several preferred embodiments of the invention are described for illustrative purposes, it being understood that the invention may be embodied in other forms not specifically shown in the drawings.

FIG. 1 is a representation of the improvement to latency 21, energy efficiency 22, throughput 23 and bit flow density 24 for the present invention. As shown, the HyPPI solution of the current invention 11 provides reduced latency and reduced energy consumption over traditional electrical 12, plasmonic 14 and photonic 13 solutions, while at the same time providing increased throughput and bit flow density. The HyPPI solution 11 is a hybridization of plasmonics and photonics. In one embodiment, the invention combines active (e.g., where light is manipulated and detected by using plasmonic-integrated solutions with active electrical drivers) with passive (e.g., where the light is simply routed passively by silicon-based photonic waveguides without any exterior drivers) solutions, which needs to be controlled by electrical circuits for light generation, modulation and detection. (e.g., an electrical driver is needed to switch the plasmonic-integrated modulator and electrical sources are needed to pump the light source and create voltage bias on the photodetector).

Figure 2A:
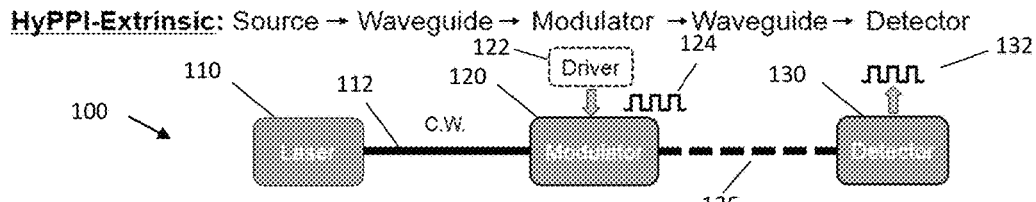
FIGS. 2(*a*), 2(*b*) illustrate two modulation strategies for HyPPI.
Figure 2B:
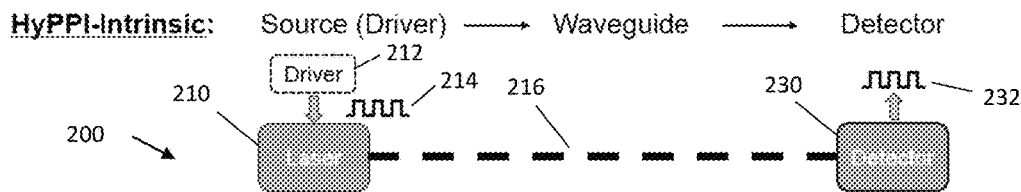

Turning to FIG. 2, one illustrative and non-limiting embodiment of the invention is shown. Here, two systems 100 and 200 are provided that combine Plasmonic components with photonic components. The invention can be implemented as an extrinsic system 100 (FIG. 2(a)) or an intrinsic system 200 (FIG. 2(b)). The extrinsic system 100 includes plasmonic-integrated (active) components/solutions such as a laser 110, modulator 120, and detector 130, and also photonic (passive) solutions such as the laser output signal on the laser signal waveguide 112, and the modulated output signal on the modulated output waveguide 126. In one embodiment of the invention for instance, the active and passive can be distinguished by whether or not the component needs electric power to achieve its function. It also includes electronics solutions, such as the driver 122, which is able to generate the electronic control signals 124, and the detected output 132 that generated by the photodetector. The waveguides 112, 126 are photonic silicon-on-insulator (SOI) waveguides with a scale slightly larger than the light diffraction limit (which in this case is about 220 nm for a 1550 nm wavelength light source). The imaginary part of the refractive index of silicon among 1550 nm wavelength is approximately to zero which means the material loss around this wavelength is about zero and makes it commonly used as a passive waveguide material. In general these waveguides are considered to be rib and ridge-type waveguides.

The laser 110 is an active Plasmonic device that generates photons (light) and outputs them as a continuous wave (CW) signal on the laser output waveguide 112, which is a passive photonic element. The modulator 120 receives the CW signal on waveguide 112 from the laser 110. The modulator 120 also controlled by an electronic data signal 124 that is generated from the electrical driver 122. The driver 122 gets its data from an external source such as a circuit or a processing component or device. The modulator 120 adds the electrical data 124 onto the CW it receives from the waveguide 112, such as for example by switching the modulator ON and OFF by the driver to encode the electrical data 124 onto the optical data, and send it back to the waveguide 112 (i.e., it converts the electronic data 124 into the optical domain). The modulator 120 can be, for example, an electro-optic modulator, and outputs the modulated signal onto the modulated signal waveguide 126, which is optical (light). The laser signal waveguide 112 and the modulated signal waveguide 126 are physically connected, while the modulator 120 is optically coupled to them by using certain types of photonic-plasmonic couplers on both ends. The modulated signal on the modulated signal waveguide 126 is received by the detector 130, which generates an electronic output signal 132 based on the optical signal it receives (i.e., it converts the optical data back to electrical domain). The detector 130 is optically connected with the modulated signal waveguide 126. The output electrical signal 132 should match with the control signal 124 plus certain channel noise. The output signal 132 can be used for a variety of things such as, for instance, further computation, storage, or control.

FIG. 2(b) shows an intrinsic implementation of the system 200 having plasmonic (active) solutions including a laser 210 and detector 230, and photonic (passive) solutions including the laser output on the laser output waveguide 216, and also electronic solutions such as the laser driver 212, an electronic data input signal 214 as laser control signal, and the detected output 232. The intrinsic system 200 is similar to the extrinsic system 100, but does not include a modulator 120. Instead of keeping the laser 110 ON all the time, as in FIG. 2(a), the laser 210 is turned ON and OFF very quickly follows the control signal 214. A high-level electrical signal pumps the laser 210 while a low-level signal keeps the laser 210 with no output. Therefore, the control signal 214 can be transformed into pieces of light in the optical domain. The laser 210 can be a plasmonic laser device, which can be extremely fast operated, and be energy and footprint efficient compared to photonic devices. By eliminating the need for a modulator, the system 200 requires less energy, and changes modulator light of the laser 210 directly, which provides a simpler link. Thus, the modulation is essentially performed intrinsically by the laser in order to achieve the function of the modulator 120, which converts the electrical signals into optical domain.

It is noted that the drivers 122, 212 do not drive a big photonic structure. Rather, it drives a tiny nanoplasmonic device, such as a small nanoplasmonic modulator (FIG. 2(a)) or a small nanocavity laser (FIG. 2(b)). The fact that this device has extremely smaller footprint, the driver consumes much less power, which means it is able to run at a much higher frequency without any thermal issues.

Figure 3A:
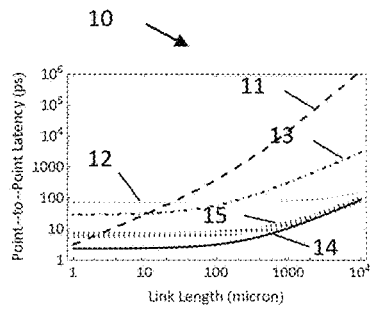
FIGS. 3(*a*), 3(*b*) are graphs that show the point-to-point latency (100) and energy efficiency (200) comparison. The electrical link is able to provide extremely low delay (110) and energy efficiency (210) over micron-scale distances due to its length dependent RC characteristics, but loses its advantages in long link lengths. The latency for the photonic (120) and HyPPI links (140, 150) are dominated by both the various active devices and the waveguide propagation timescales in short link lengths, and by the waveguide only for long propagation distances, and the flat energy efficiency profile (220, 240, 250) is basically due to the use of low loss SOI waveguide. The plasmonic link latency (130) and energy efficiency (230) limitation both grow due to repetition every 100 μm.

FIGS. 3(a) and (b) show the latency (10) and energy (20) performance characteristics for the HyPPI solutions (both extrinsic and intrinsic) of the present invention, with respect to the link length (the distance that a signal needs to be delivered) and compare them with other technology options, such as conventional electrical, photonic and plasmonic interconnects. The latency performance in the unit of picosecond is defined as the sum of the signal traveling time on the waveguides in FIG. 2 (112, 126, 216), the modulation time costs by the drivers and modulator in FIG. 2 (120, 122, 210, 212) and the detection time costs by the detectors in FIG. 2 (130, 230). The energy performance in the unit of femto-joule per bit is defined as the total energy consumed by the entire link, which includes the laser energy cost by 110, 210, driving energy cost by 122, 212, the modulator energy cost by 120 and detector energy cost by 130 and 230.

As shown in FIG. 3(a), electrical interconnect (11) is able to provide the best result for logic-scale communications (below 3 micrometer range). But, if the signal has to travel greater distances (such as 100 micrometer, a millimeter or a centimeter even), then HyPPI becomes the best option since the light travels with a speed in the order of $10^8$ m/s and therefore longer link length won't bring obvious extra latency. However, the latency of the electrical interconnect depends on the RC (resistance-capacitance) delay of the channel which scales with the distance (4 orders of magnitude longer channel length costs over 6 orders higher latency). The photonic interconnect (13) option has the same characteristics as HyPPI since it is using the same type of waveguide. However, the initial latency value (latency at the shortest link length) of the photonic option is much higher than in HyPPI (>60 ps higher latency) due to the lower modulator and detector speed and low light matter interaction. The latency for plasmonic interconnect (13) shoots up dramatically with length due to its high ohmic losses in the waveguide and short propagation distance. Therefore, a plasmonic interconnect needs repeaters for every 100 micrometer distance which adds significant overhead.

Figure 3B:
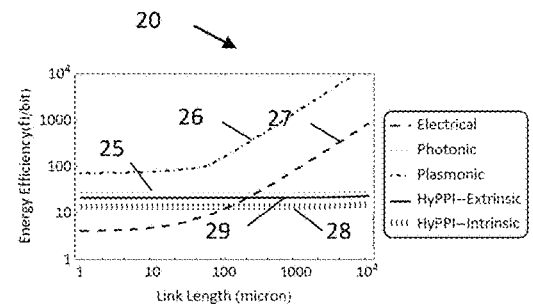

FIG. 3(b) shows a similar pattern when compared with FIG. 3(a). Electrical interconnect (27) wins at lower link lengths (below 100 micrometers) due to its nano-scale footprints (few tens of nanometers). For longer link distance (above 100 micrometers), the energy consumption of electrical interconnect exceeds the HyPPI's and leaves HyPPI the best option for this range (HyPPI option can cost 2 orders of magnitude less energy than electrical option at 1 cm link length). The flat energy consumption characteristic for HyPPI (29, 28) and photonic interconnect (25) is due to the low loss of the photonic waveguides (112. 126, 216). The energy consumption of plasmonic interconnect (26) shoots up due to repetitions.

Figure 4A:
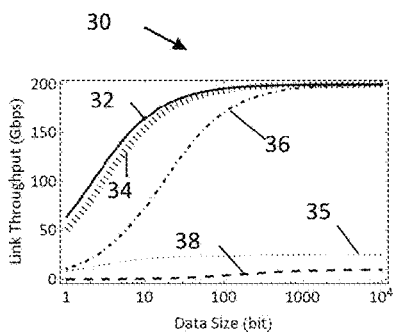
FIGS. 4(*a*), 4(*b*) are charts that show the comparison of link throughput with a fixed link length (1 mm) (FIG. 4(*a*), 100), and a fixed packet size (64 bits) (FIG. 4(*b*), 200). No WDM was assumed here and all interconnects are using 1550 nm wavelength. HyPPI interconnects (140, 150, 240, 250) provide much higher performance than other interconnect options (110, 120, 130, 210, 220, 230) in both cases.
Figure 4B:
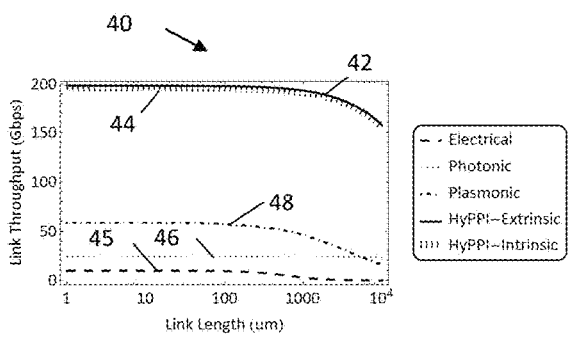

FIGS. 4(a), (b) show the link throughput for five different interconnect options over the data size (30) and link length (40) respectively. The link throughput is defined as the number of bits divided by the entire time for sending those. Two figures saturated on the right and left hand side and the maximum values are defined by the slowest device speed on that link (e.g., 120, 122, 130, 210, 212 and 230 of FIG. 2). The current hybrid approach (32, 34, 42, 44) provides up to 20 times greater throughput as a function of data size and link length with lower energy consumption and latency in longer communication range (FIGS. 3-4).

FIG. 5 shows the comprehensive energy-latency comparisons. FIG. 5(a) defines the energy delay product (ET) figure of merit (50), which shows the tradeoff between energy and performance for different interconnect technology options and lower value represents better overall performance. FIG. 5(b) defines a similar figure of merit called energy delay square product ($ET^2$, 60), which shows the tradeoff between the energy and a more performance-sensitive factor since nowadays on-chip interconnects require higher performance that needs to be compensated by much higher energy under certain applications, such as high performance computing. And the lower the energy requirement, the better. The figures show pretty similar results that electrical interconnect (52, 62) gives the best ET and $ET^2$ below 5 micrometers, and HyPPI (58, 56, 68, 66) dominates beyond that scale.

FIG. 6 shows the crosstalk length (50) and propagation speed (60) for SOI and surface plasmon polaritons (SPPs) waveguides. The SOI waveguides are the waveguides used in 112, 126 and 216 in FIG. 2. The SPP waveguide is the waveguide used in the plasmonic interconnect (120, 122, 64). The crosstalk lengths, which is defined as the length that allows 25% of energy leaks from one waveguide to its adjacent waveguides, are compared for two kinds of waveguides under different dimensions and spacing (gap). Also in FIG. 6(b) the propagation speed of light in two different kinds of waveguides under different dimensions. As shown in FIG. 6(a), the initial crosstalk length on the left hand side for SOI (77, 78) and SPP (71, 72) waveguides are similar and basically below 100 micrometers. However, by increasing the waveguide dimensions, the crosstalk length of the SOI waveguide increases much faster than the SPP waveguides and easily reaches the chip scale from about 400 nm dimension (shaded area, >1 cm). The insets in FIG. 6(a) are the symmetric (74, 73) and anti-symmetric (76, 75) fundamental light mode (cross-section) in two parallel SOI and SPP waveguides. In FIG. 6(b), the light speed in the SOI and SPP waveguides are normalized to the speed of light in vacuum ($c_o$,) and the insets (84, 82) are the cross-sections of fundamental light mode in single waveguides. The purpose for this figure is to find a dimension and gap combination that has longer crosstalk length while allows light to propagate faster.

FIG. 7 is the summary figure that synthesizes all the models that previously discussed, including the latency and energy models (FIG. 3), the throughput model (FIG. 4), the crosstalk and propagation speed models (FIG. 6) and an on-chip footprint model that is based on the devices used in HyPPI (FIG. 2). It shows four bit flow density (BFD) contour color maps (FIGS. 7(a), (b), (c), (d)) for plasmonic, photonic, HyPPI extrinsic and HyPPI intrinsic links with waveguide size and waveguide gap on two axes. The waveguide size represents the scale of the waveguide and the waveguide gap defines the packing density of that kind of technology option. The bit flow density is defined as the number of bits that are able to be delivered within a certain chip area (1 mm by 1 mm in this case) and the higher BFD represents a faster link with lower energy cost and latency and able to resist higher crosstalk and propagates through longer distance. Here in these case, all the bit flow density results are normalized to a zero-to-one scale (500), where zero (504) represents the lowest BFD among four interconnect options (100, 200, 300, 400) and one (502) represents the highest. The result shows that the HyPPI (300, 400) is able to provide the highest BFD at about 350 nm waveguide width (beyond diffraction limit) with few tens of nm gap. In addition, the plasmonic interconnect (100) is able to provide a relatively higher BFD under diffraction limit with a 100 nm waveguide radius with 400 nm gap combination.

With a network-on-chip (NoC) application in mind, the network's performance inherently relies on the characteristics of its building blocks, namely the interconnect links. For an electrical interconnect, the P2P latency is defined as the time a single bit of data packet requires to travel from the sender to the receiver. For a photonic or a HyPPI (plasmonic) interconnect, latency includes the time of propagation that a photon (SPP) requires to propagate from the light source across the link to the photoreceiver, which includes the amplification circuit. Thus, for every optical link type investigated here, the latency can be estimated by summing up each device's individual latency plus the light propagation time.

Given the technologically mature option to use electrical interconnects, the entire link including wires and other components can be combined into a series of RC (R=Resistance, C=Capacitance) lumped elements given by the selected technology node (i.e. 14 nm technology node is considered here based on ITRS) as in Equations 1 and 2 below. The on-resistance of the minimum size n-FET $R_{on}$, parasitic driver capacitance $C_{par,dr}$ load capacitance $C_L$, optimum number and size of the repeaters $k_{opt}$ and $h_{opt}$ and the per unit length resistance/capacitance $r_{int}/c_{int}$ in the equations all are based on Rakheja & Kumar [7].

$$t_{p2p-el} = 0.69R_{on}(C_{par,dr} + C_L) + 0.69(R_{on}c_{int} + r_{int}C_{fan})L + 0.38r_{int}c_{int}L^2 \tag{1}$$

$$E_{el} = \frac{1}{2}(c_{int}L + C_o k_{opt} h_{opt})V_{DD}^2 \tag{2}$$

However, for photonic and HyPPI interconnects, the light source is considered to be on-chip and is kept ON at all times during operation for extrinsic modulation. Hence, we can safely neglect the source delay; except for the HyPPI intrinsic modulation because we manipulate the signal directly at the laser not the modulator. Moreover, the latency caused by the source should also be considered for the plasmonic option due to its short propagation length; the entire link structure needs to be repeated using the previous signal output to drive the light source in the next segment in an iterative way. The plasmonic lasers for plasmonic and HyPPI interconnects are borrowed from Lau et al. and Ren-Min et al. [11, 78].

For all four optical link options (photonic, plasmonic, HyPPI-intrinsic and HyPPI-extrinsic) the waveguide delay was estimated based on its material composition, waveguide's structural shape and propagating light wavelength. Here, we estimate the fundamental mode effective index $n_{eff}$=3 for classic photonic SOI waveguide with moderate loss of 0.5 dB/cm and an Ag—$SiO_2$ SPP waveguide with $n_{eff}$=1.457 and 440 dB/cm attenuation losses [8, 9]. All the numbers are given for 1550 nm wavelength. Using Equations 3 and 4, we can calculate the waveguide propagation speed (waveguide latency) and maximum propagation length. For consistency and comparability, similar waveguide cross-sectional shapes were used for the waveguides investigated. Note, the propagation length $L_{1/e}$ for an SOI waveguide could easily reach few centimeters (~9 cm), which is far beyond the chip-scale. However, for the SPP waveguide, this length is reduced up to 100 microns. Therefore, in the following discussion we assume that photonic and HyPPI interconnects use an SOI waveguide for light transmission and do not need repeaters with the exception of plasmonic links, which repeats every 100 μm.

$$\text{Propagation speed } v = \frac{c}{n_{eff}} \quad (3)$$

$$\text{Propagation length } L_{1/e} = \frac{\text{total loss}}{\text{unit loss}} = \frac{\left|10 \cdot lg\frac{1}{e}\right|}{\text{unit loss}} \quad (4)$$

We studied a wide range of active devices (lasers [10, 11], modulators [21-47] and detectors [48-72]) with different structures, materials and technical approaches. The selection for each device is not limited to the device maximum operating speed or estimated energy consumption, but also includes the on-chip footprint, insertion loss, responsivity, cooperation with other devices, and other on-chip characteristics such as temperature dependence and wavelength spectrum etc.

to those found in silicon-on-insulator (SOI) platforms. In the extrinsic modulation link, instead of using conventional photonic ring-based modulator or the novel microdisk modulator [18], we use an ITO electro-optical modulator using SOI hybrid integration similar to the plasmonic link not only to achieve fast operation and low energy consumption, but also to have an advantage in structural matching since the base structure of the ITO modulator is an SOI waveguide [46]. We should point out that when the link loss is reasonably low, new source technologies can be considered, which offer power savings and unprecedented-fast intrinsic modulation as found in the emerging nano-cavity plasmon lasers and LED devices [10, 11, 78].

The electrical supporting components (i.e., device drivers) specifications are based on the 22 nm technology node [73]. Since the timeframe of all the optical devices used is in the range of 2009-2014, we chose the technology node level of the year 2012 for predicting electrical components performances. Since the latency of the driver is determined by its RC delay which is proportional to the device capacitance it drives, driver(s) latencies could be calculated using the prediction of Chen et al. (9.5 ps for 24 fF size modulator) [73].

To obtain scaled down optoelectronic devices, the reduced LMI is compensated by field enhancements and high optical density of states. These wavelength size sources only provide tens to hundreds of micro watts of optical power, and utilize modified rate equations allowing for minuscule power consumption, small footprint, and fast data operation. The latter enables bypassing the external electro-optic modulator altogether. The laser is modulated via an electrical driver (intrinsic modulation). The latencies of the various devices utilized are summarized in Table 1. The stated values of Tables 1-3 are exemplary based on existing device demonstrations.

TABLE 1

Latency (ps) of each considered device for different interconnects with link length L in μm.

| Component | Photonic Interconnects | Plasmonic Interconnects | HyPPI Intrinsic Modulation | HyPPI Extrinsic Modulation |
|---|---|---|---|---|
| Laser/LED | N/A | 5 | 5 | N/A |
| Modulator | 40 | 16.7 | N/A | 0.5 |
| Modulator Driver | 5.9 | 5.5 | N/A | 0.4 |
| Waveguide | 8.3 × $10^{-3}$L | 4.9 × $10^{-3}$L | 8.3 × $10^{-3}$L | 8.3 × $10^{-3}$L |
| Detector | 25 | 1.4 | 1.4 | 1.4 |
| Total (propagation + manipulation) | 8.3 × $10^{-3}$L + 70.9 | (4.9 × $10^{-3}$L + 28.6)/100 μm | 8.3 × $10^{-3}$L + 6.4 | 8.3 × $10^{-3}$L + 2.3 |

For the photonic interconnect, we use a femtojoule level athermal silicon microdisk modulator from Timurdogan et al. [18] and a zero-bias waveguide photodetector from Vivien et al. [58]. For the plasmonic interconnect, we borrowed the modulator and detector from Dionne et al. [26] and Mousavi et al. [64] respectively. For these devices, the latencies are simply regarded as the reciprocal of their operating frequency (60 GHz and 700 GHz respectively based on their RC delay).

For the proposed extrinsic and intrinsic HyPPI interconnects, our aim is to reduce the link latency by using ultra-fast plasmonic active devices, while maintaining chip-size long-range propagation via low-loss photonic waveguides similar Comparing the P2P latency of the various five different interconnects versus link length shows that the plasmonics can indeed outperform pure photonic links due to its higher LMI in the limit of propagation lengths (FIG. 2(a)). However, the delay for plasmonic links grows when repeaters are required (~100 μm), thus limiting the use of these links to local communication ranges only. The high performance of Silicon photonics can be seen by the relatively short crossover length (~20 μm) with electrical interconnects. To that end, pure plasmonics are a questionable interconnect technology unless other synergies with existing infrastructure such as CMOS would allow us to reduce other technological relevant parameters such as cost. HyPPI can provide much lower P2P latency for both local range due to high LMI and sub-wavelength-scale footprint devices and chip-size communications, due to the long-range propagation of silicon photonics $\alpha_{SOI\text{-}waveguide} \leq 0.5$ dB/cm).

The link energy efficiency is directly related to the performance of the network and important for both internal and external considerations [4]; internally it relates to integration density, temperature budgets, and tuning overhead, whereas externally it relates to overall power consumption and battery life.

of HyPPI consume less energy per second (power) because it also operates at a higher frequency. The energy efficiency, lasing efficiency and power loss in dB of each of the considered interconnects are listed in Table 2 and 3 broken down based on the same devices used in the latency analysis.

$$\text{Laser Power per bit} = \frac{I_{min}}{BW \times \text{Responsivity} \times \text{Efficiency}} \times 10^{\frac{|loss|}{10}} \quad (5)$$

TABLE 2

Energy efficiency (fJ/bit) of each considered device for different interconnects with link length L in μm, the minimum output current level $I_{min}$ here is 50 μA.

| Component | Photonic Interconnects | Plasmonic Interconnects | HyPPI-Intrinsic | HyPPI-Extrinsic |
|---|---|---|---|---|
| Laser/LED | $2.5 \times 10^{(7.02+0.00005L)/10}$ | $8.3 \times 10^{(8.1+0.044L)/10}$ | $2.5 \times 10^{(7.0+0.00005L)/10}$ | $2.5 \times 10^{(8.1+0.00005L)/10}$ |
| Source Driver | N/A | N/A | 1 | N/A |
| Modulator | 2.77 | 6.80 | N/A | 4.25 |
| Modulator Driver | 11.88 | 11.08 | N/A | 0.74 |
| Detector | 0 | 0.14 | 0.14 | 0.14 |
| Total | $14.65 + 2.5 \times 10^{(7.02+0.00005L)/10}$ | $18.02 + 8.3 \times 10^{(8.1+0.044L)/10}$, $L \leq 100$ μm | $1.14 + 2.5 \times 10^{(7.0+0.00005L)/10}$ | $5.13 + 2.5 \times 10^{(8.1+0.00005L)/10}$ |

While the power consumption of the source in optical links has been included in roadmaps, it has usually been omitted in the literature since it is typically regarded as an off-chip component due to the high power consumption, and subsequent heat dissipation [4, 7, 73]. Here, we calculate the required laser power by summarizing the link device losses, photonic-plasmonic coupler loss and the power loss of the entire propagation path to ensure output electrical signal generated by detectors based on responsivity (R) still meet the minimum current requirements for the next stage after such losses (Eqn. 5).

In Table 2, we use the same devices when calculating the link latencies and the losses for SOI and we borrow from Li et al. and Berini et al. [8, 9] the values for SPP waveguides. The output minimum current level $I_{min}$ is assumed to be 50 μA, which is a moderate value for driving electrical circuits or blocks, but still highly depended on the energy requirement of the next stage. The bandwidth (operating speed) for photonic link (25 GHz) and plasmonic (60 GHz) are limited by their modulation speed and HyPPI-Intrinsic links (200 GHz) are limited by the switching speed of the light source. Although the light source of the HyPPI-Extrinsic link could be regarded as ON all the time and will not affect the overall operating speed, its speed is also been constrained to 200 GHz for fair comparison. Although some of the performance results are based on optimized theoretical calculation and prediction, exploratory devices have shown to demonstrate over 100 GHz speed and the speed is still increasing [74].

Similar to the latency assumption, the energy consumption for the drivers are also considered and predicted following the same methodology in the previous section. The driver energy consumption is highly based on the applied voltage and the capacitance of device it drives. Therefore, the driver energy equation for a single charge (operation) can be approximated to be $\frac{1}{2}CV^2$. Under the same technology node, the voltage levels are usually the same. The driver energy efficiency for HyPPI-extrinsic option shows smaller than the photonic and plasmonic interconnects. This is because the modulator we use has a much smaller device capacitance (size). However, that does not mean the driver

TABLE 3

Power loss break down and detector responsivities.
Link length L in the unit of μm.

| Component | Photonic Interconnects | Plasmonic Interconnects | HyPPI-Intrinsic | HyPPI-Extrinsic |
|---|---|---|---|---|
| Laser Efficiency (%) | 25 | 20 | 20 | 20 |
| Modulator (dB) | 1.02 | 1.1 | — | 0.6 |
| Waveguide (dB) | $5 \times 10^{-5}L$ | $4.4 \times 10^{-2}L$ | $5 \times 10^{-5}L$ | $5 \times 10^{-5}L$ |
| Coupler (dB) | — | (included in the modulator part) | — | 0.5 |
| Responsivity (A/W) | 0.8 | 0.1 | 0.1 | 0.1 |

For comparison, the electrical link is plotted based on its length dependent RC structure mentioned in Section 2.1 [7]. Comparing the energy efficiency with the other four different optical interconnects reveals a significant reduction in power consumption for the links, which use passive SOI waveguide for signal transmission at longer communication distance. However, due to the insertion loss, propagation loss and low optical-electrical conversion efficiency demands that certain amount of energy overhead must be paid which also makes the electrical option more suitable at shorter communication ranges with respect to energy side (FIG. 2(b)). On the other hand, for a long communication range, the photonic and HyPPI interconnects show much better scaling because of the low attenuation loss of the passive SOI waveguide.

The plasmonic link can provide better performance by sacrificing transmission distance, whereas HyPPI links are able to outperform the photonic and plasmonic links in both metrics.

The intrinsic modulation type of HyPPI saves more energy by not using the modulator, but its speed is subject to source modulation speeds. Moreover, the energy efficiency that the model predicts is an upper-bound energy consumption for each link because all the numbers borrowed from other papers as shown in Table 2 are based on the maximum bandwidth of each device. However, in real applications, the data rate will be dependent on the data rate of the slowest component of the link as it will be the bottleneck. Also, we note that a device operating at a lower data rate will consume less energy.

Throughput of a link, which is commonly defined as a measure of how many units of information (bits) a "medium" (network) can deliver in a given time period, is another critical metric for evaluating the performance of a link. We can express it as a function of the operating frequency of each device, the propagation length for the signal to be transported from P2P latency and the data packet size (D), Eqn. (6). Thus, throughput is equal to the data packet size (D) divided by the total time to transmit the data through the link and the latter is the sum of the data sending and the data propagation time) and capacity (the maximum message sending rate, which is defined by the Nyquist equation) used in the performance comparison.

In reality, D depends on the different traffic patterns and protocols under a particular computational application. Capacity (Eqn. (7) [bit/s]) refers to the data-carrying ability of a network, indicates that the maximum amount of data that can pass from one point to another per unit time as in Eqn. (7) (Bandwidth (BW, [Hz])). FIG. 3 shows schematic diagrams for throughput and capacity. Moreover, since the Nyquist equation can only predict the highest capacity for ideal links without noise, we only take half of its results to match with real communication situations. Note, the definition of the term BW is not unique; for instance Rakheja [7] proposed to define it as the reciprocal of the P2P latency of the entire link. Under this assumption, every bit is sent only after the previous bit has arrived at the end of the link, which results in a rather low capacity, and therefore can be regarded as a lower bound. In contrast, we regard bandwidth of each device in the link as operating as close as possible to its designed frequency, and therefore our capacity definition establishes an upper bound.

It is worth mentioning that decreasing the data packet size or increasing the link length will both negatively affect the throughput (FIGS. 4(a), (b)). This can be understood from analyzing Equation 6; decreasing D for a fixed link length (i.e. P2P latency) will decrease the denominator at a slower rate than the numerator; however, increasing the link length for a given D also decreases the throughput of the link. Comparing the throughput for the five link types clearly shows an absolute advantage for HyPPI in providing a high throughput with good response to increasing the data size and high resistivity to increasing the link length. The throughput here is only for single wavelength carrier, though WDM technology can also be provided.

$$\text{Throughput} = D \Big/ \Big( \frac{D}{\text{Capacity}} + t_{p2p} \Big) \quad (6)$$

$$\text{Capacity} = 2 \times BW \times \log_2(M) \quad (7)$$

Next, we use the metric proposed by Martin, Nystroem and Penzes termed $ET^n$, in which E stands for the energy consumption in the unit of Joules and T for the delay (latency) of the system or network [16]. By multiplying the energy efficiency (E', [J/bit]) by throughput (Th, [bit/s]), we get the operational power (P in [W]). Power times P2P latency (T, [s]) results in the total energy consumption (E, [J]) of the link. Note, n in $ET^n$ metric denotes a weight that represents the degree of correlation between two criteria. For n=1 (Eqn. 8), a decrease in latency is considered as valuable as a reduction in energy consumption at the same proportion, and n=2 is a metric independent of the power supply voltage (Eqn. 9) [75]. For n=z, when comparing the tradeoffs, more energy consumption for small latency improvement in interconnects that a) have a composite performance which is more sensitive to latency, and b) have a relative surplus in its power budget. Note that n=0 just the energy efficiency metric we already mentioned in the previous section. Therefore, the $ET^n$ metric can be used to optimize the weighted energy consumption and system latency simultaneously, and is consistent with priorities of High Performance Computing (HPC) [76].

$$\text{Energy Delay Product} = E^1 \times Th \times T \times T = P \times T \times T = ET \quad (8)$$

$$\text{Energy Delay Squared Product} = E^1 \times Th \times T \times T^2 = P \times T \times T^2 = ET^2 \quad (9)$$

Our results show that the electrical link is superior for link lengths below 5 μm. This is obvious, when considering that the resistance and capacitance is dependent on the link length, and therefore causes smaller latency and energy consumption for short lengths (FIGS. 5(a), (b)). In contrast for such short lengths, any optical solution has only RC delay from the active components and drivers as a small part, can have fundamental inefficiencies due to a quantum efficiency less than 100%. Moreover, due to the different on-chip device footprint for each technology option, the curves to the left side (shorter link length) begin at different points. FIGS. 5(a), 5(b) show absolute advantages for HyP-PIs above ~10 μm link length and this again proves that a HyPPI backbone network with local electric interconnects branches is the best alternative.

Additionally, link of about 100 μm in length can be regarded as a general break-even point for electrical, plasmonic and photonic links. This can be qualitatively understood as the boundary between local to medium range (<100 μm) and long range (>100 μm) communications, and may lead to a design rule for NoC that are composites of multiple link technologies.

While the P2P latency, energy efficiency, link throughput and the ETn metrics are important to understand a link's intrinsic features, crosstalk is a characteristic related more directly to NoC architectures.

Here, we define acceptable distance for crosstalk to be the link length where the energy leakage is 25% from one waveguide to its adjacent neighbor and quantify the crosstalk coupling length of two waveguides. Thus, the total leakage from two adjacent waveguides will cause a maximum 50% energy interference and this is the upper limit of a binary coding system could sustain (below "0.5" as off/zero state and above "0.5" as on/one state). We determine the crosstalk by simulating the eigenmode of the two waveguide structures and solving for the difference between their symmetric and asymmetric modes.

FIG. 6 shows how close a channel can be placed to another channel to avoid optical coupling (leakage from one channel to the other channel). This figure shows how to change the waveguide to avoid crosstalk. More specifically, FIGS. 6(a) and 6(b) show that the SOI waveguide mode is cut-off at a dimension of $t_{SOI}$=220 nm, which can be estimated by the Abbe Limit (t=λ/2n, where λ is the free space wavelength, and n is the effective mode index, which is close to the material index of Silicon at 1550 nm).

In contrast, the plasmonic mode is able to provide sub-diffraction limited (non-cutoff) modes and is hence more suitable for highly integrated chip size (<1 cm) and local-range communication (<100 µm). For an SOI waveguide, the maximum coupling length increases rapidly with waveguide dimension and the inter-waveguide spacing (gap) and can easily reach the 1 cm chip size with a gap much smaller than its dimension. This leaves us with two choices; either a longer propagation distance at the cost of a larger waveguide footprint (area) or a denser waveguide arrangement with only local range communication.

Note, the small diameter plasmonic waveguide (e.g. 50 nm radius, FIG. 6(a)) has essentially the same crosstalk length as to the larger scale plasmonic waveguide (e.g. 300 nm and 500 nm) but is still not practical for on-chip use due to its low optical mode propagation speed amplified by repeaters (i.e. high latency). We deploy an eigenmode solver to obtain the propagation speed based on the effective mode index for both the SOI photonic and metal embedded dielectric plasmonic waveguide (FIG. 6(b)).

The propagation speed of plasmonic waveguides reduces significantly when the dimension of the waveguide drops below 100 nm. In addition, based on conclusions from FIG. 3(a), the major component of the P2P latency after increasing the link length is the propagation time through the waveguide. For instance, for a 50 nm radius plasmonic waveguide, the signal only has about half of its maximum speed of light, which will cause an unacceptable delay for the entire link. The latter is another reason why pure plasmonic interconnects might not be a practical option alone despite footprint savings on-chip.

On the contrary, the SOI waveguide has an opposite speed pattern with higher speeds for smaller waveguide dimension (i.e. lower effective index). Although the crosstalk length has little difference between two waveguides of about 300 nm or smaller, the higher propagation speed favors the photonic waveguide resulting in a better link latency and higher throughput.

Furthermore for larger waveguide dimensions, the speed of the photonic waveguide decreases rapidly while the speed of plasmonic waveguide stays almost constant. However, this in return increases the crosstalk length of the photonic waveguide exponentially and can easily reach 1 cm chip size with much less spacing. In other words, even though the propagation time through each single link increases, the gap between two parallel waveguides can be reduced. This would increase the packing density and also would result in higher total throughput density. Note, we only considered the simplest crosstalk model from two adjacent waveguides (25% energy leakage from each waveguide) here for network level performance prediction, which can be regarded as the minimum crosstalk length on-chip since in an integrated waveguide array, the crosstalk will not only comes from the nearest waveguide, but also the second-, third- nearest waveguide(s) etc. and this has already been proved by Song et al. [77]. The invention can account for not only multi-waveguides crosstalk but also device-to-waveguide and device-to-device crosstalk in a real optical network structure.

Crosstalk limits the maximum communication length. On the other hand, the propagation length determines the actual length a signal travels before a repeater is needed. Together these quantifiers define over that distance an interconnect link can deliver a signal before it is undetectable by the receiver and without interfering with other waveguides.

In detail, the dimension (size) of the transmission waveguide and the spacing (gap) between two adjacent waveguides has the most influence on the propagation length and the waveguide-to-waveguide coupling levels respectively. Therefore, it is reasonable to conclude that by increasing the waveguide dimensions and the gap between waveguides, the signal can be delivered a longer distance, however increasing the waveguide dimension and the gap between adjacent waveguides would limits the on-chip footprint (area) and packing density. Thus, we believe there should be an optimal size-to-gap ratio given certain communication requirements. We quantify this footprint-performance trade-off by defining "Bit Flow Density".

We generally refer to Bit Flow Density (BFD) as the number of bits transmitted through a certain chip width (cross-section) to reach a specific required communication length, which is highly related to the size of each device and spacing. The three major elements in chip area calculations we assume are 1) the size of the light sources (laser, LED), 2) modulators (microdisk modulator, PlasMOStor modulator and ITO modulator), and 3) the waveguide area including waveguide-to-waveguide spacing. Note, the area of detectors are not considered here since the output current level at the end of each link is highly dependent on the requirements of the next circuit block and additional amplifiers may be needed as well.

Each of the four different on-chip packing layouts is arranged within a 1×1 mm$^2$ chip area. The laser size (10 µm×20 µm) for photonic links is taken from the DSENT database [5], and the 20×40×140 nm$^3$ core dimension 200 GHz nLED proposed by Lau et al. covered by passivation and silver layers with total on-chip size 80×140×200 nm$^3$. The microdisk modulator (~5 µm diameter) is simplified to an annulus structure on this 2D layout, and the space between the ring and the waveguide on one side is much closer (150 nm) than the three other sides for coupling purposes [24]. The larger spacing is used to avoid coupling and its value is determined by eigenmode simulations. The ITO based electro-optical modulator is used in both plasmonic and HyPPI links with a 2 µm device length [10]. The width of the ITO modulator can be regarded as being built "on" the waveguide device and costs no additional flat area due to its compact structure. The detectors used for photonic links and plasmonic/HyPPI links have the on-chip size 10×10 µm$^2$ and 2×2 µm$^2$ respectively.

FIG. 7 shows the resulting Bit Flow Density heat map for our four interconnect links. As expected, plasmonic interconnects achieve their highest value in the center of its plot, which indicates that plasmonic links are able to provide high data transmission rates over a certain chip scale with smaller waveguide diameter and gap compared to its photonic counterpart (FIG. 7(a)). However, when the waveguide diameter scale below 50 nm, the crosstalk length and the propagation length respectively will become even smaller than the side length of the PlasMOStor modulator and therefore causes a longer bit flow density.

On the other hand, all the high bit flow density regions are shown on the right hand side (waveguide width>300 nm) of their plots for both photonic and HyPPI links due to the low crosstalk length (needs more repeaters to propagate enough distance) of SOI waveguides below 300 nm waveguide width. There is only one exception; the lower left corner of the HyPPI intrinsic modulation link is significantly higher than any other regions below a width of 300 nm. This is because the modulators are absent for this interconnect, and therefore smaller waveguide widths and gaps lead to much denser link arrangements.

By comparing all four contour plots, we can conclude that HyPPI (especially intrinsic modulation links) can provide much higher bit flow density rather than both traditional photonic interconnects and plasmonic interconnects. In this regard, intrinsically modulated links combine the best of both worlds; small energy consumption from plasmonic devices and long propagation/crosstalk lengths from photonic waveguides. Such synergies are an example of a reduction in integration and design complexity, which is regarded as a key element to continue scaling on learning curves towards cost reduction and leads to what is previously termed coherent innovation [19].

We note that the BFD and total link energy for chip level photonic links are forecasted to be over 40,000 Gbps/cm$^2$, and 10-100 fJ/bit, respectively by the year 2025 [20]. Our results show that to simultaneously achieve the two roadmap goals, HyPPI links are one possible and viable innovative technique.

Accordingly, one advantage of the hybridization of the present invention is that it separates passive optical signal propagation in a low loss medium (SOI waveguides) from active fast and energy efficient device in order to reach long propagation distance while maintaining the performance brought by the plasmonic devices. It is further noted that the intrinsic and extrinsic modulation systems (FIG. 2) can have a point-to-point latency is 2-100 ps/cm, an energy per bit is 15-25 fJ/bit, a transmission loss from 1.1 to 2.1 dB/cm, a bit flow density (i.e., the number of bit that can be transferred through certain on-chip area) of 0.01~1 Gbps/μm$^2$, and a cross-section of 2 μm$^2$.

Thus, in a first illustrative and non-limiting embodiment of the invention, an intrinsic hybrid photonic plasmonic system is provided. The system has a plasmonic laser configured to generate an optical signal, a photonic waveguide configured to propagate the optical signal, and a plasmonic detector configured to detect the optical signal. A second embodiment is provided according to each of the previous embodiments, wherein said photonic waveguide is diffraction-limited. A third embodiment is provided according to each of the previous embodiments, further including an electronic driver configured to turn said plasmonic laser ON and OFF to modulate the optical signal from said plasmonic laser to load electronic data to provide a modulated optical signal, and said plasmonic detector is configured to detect the modulated optical signal. A fourth embodiment is provided according to embodiments 1-2, further comprising a plasmonic laser configured to provide the optical signal and to turn ON and OFF to add electronic data to the optical signal to provide a modulated optical signal, and said photonic detector is configured to detect the modulated optical signal.

A fifth embodiment is provided according to each of the previous embodiments, wherein the optical signal has a wavelength of 1550 nm. A sixth embodiment is provided according to each of the previous embodiments, wherein the optical signal has a wavelength and said waveguide is near-transparent for the wavelength. A seventh embodiment is provided according to each of the previous embodiments, wherein the waveguide is low loss for the wavelength.

An eighth embodiment is provided according to each of the previous embodiments, wherein the total energy cost includes the laser pumping energy, the electrical laser driver energy and the photodetector bias energy and the laser pumping energy compensates all the channel losses. A ninth embodiment is provided according to the eighth embodiment, wherein the channel losses include waveguide loss, laser efficiency, crosstalk and photodetector responsivity. A tenth embodiment is provided according to each of the previous embodiments, said system having a point-to-point latency is less than 100 ps/cm, an energy per bit is about or below 15 fJ/bit, a transmission loss less than 1.1 dB/cm, a bit flow density of 0.01~1 Gbps/μm$^2$, and a cross-section of 2 μm$^2$.

An eleventh embodiment is provided having an extrinsic hybrid photonic plasmonic system. The system includes a plasmonic laser configured to generate light, a photonic waveguide configured to propagate an optical signal, a plasmonic modulator configured to manipulate the optical signal to load electronic data into the optical signal, to provide a modulated optical signal, and a plasmonic detector configured to detect the modulated optical signal. A twelfth embodiment is provided according to the eleventh embodiment, further comprising a plasmonic laser configured to provide the optical signal to said photonic waveguide. A thirteenth embodiment is provided according to embodiments 11-12, further comprising a photonic modulated signal waveguide configured to propagate the modulated optical signal from said plasmonic modulator to said plasmonic detector with plasmonic-photonic coupler.

A fourteenth embodiment is provided according to embodiments 11-13, wherein the optical signal has a wavelength of 1550 nm. A fifteenth embodiment is provided according to embodiments 11-14, wherein the optical signal has a wavelength and said waveguide is near-transparent (low loss) for the wavelength. A sixteenth embodiment is provided according to embodiments 11-15, wherein the total energy cost includes the laser pumping energy, the electrical modulator driver energy, the modulator energy, and the photodetector bias energy and the laser pumping energy compensates all the channel losses, which includes waveguide loss, coupler loss, laser efficiency, crosstalk and photodetector responsivity. A seventeenth embodiment is provided according to embodiments 11-16, said system having a point-to-point latency is less than 100 ps/cm, an energy per bit is about or below 25 fJ/bit, a transmission loss less than 2.1 dB/cm, a bit flow density of 0.01~1 Gbps/μm$^2$, and a cross-section of 2 μm$^2$.

In addition, an eighteenth embodiment of the invention is provided having a method for calculating a laser power for photonic, plasmonic and hybrid photonic plasmonic data interconnect systems having a laser, photodetector and a link comprising a waveguide. The method comprises providing the minimum current that is required by a next stage to which the link is connected, determining at the photodetector, a minimum light power that is required by the photodetector to generate the minimum current, determining at the laser, a minimum laser output power to compensate a channel loss of the waveguide, modulator, coupler and waveguide crosstalk losses, and determining at the laser, the laser power based on laser efficiency. A nineteenth embodiment is provided according to embodiment 18, further comprising predicting at the processing device, a laser energy efficiency in the unit of J/bit based on different cavities of the laser and coding schemes for the intrinsic system of embodiments 1-10.

A twentieth embodiment is provided according to embodiments 18-19, wherein different laser cavities give laser different power efficiency at under different scaling and the coding schemes affect the coding efficiency, which further affect the energy that a laser needs to send a bit of data. A twenty-first embodiment is provided according to embodiments 18-20, further comprising predicting at the processing device, a required laser energy for different device cavities and photonic waveguides for the extrinsic system of embodiments 11-17.

A twenty-second embodiment is provided having a method for predicting the capacity of an entire channel. The method comprises calculating a maximum bandwidth of the channel in hertz based on a lowest bandwidth device on the channel, and calculating a channel capacity of the channel in bits per second by using the maximum bandwidth and a signal-to-noise ratio (SNR) of the channel, wherein the channel capacity equals to bandwidth×$\log_2$(1+SNR). A twenty-third embodiment is provided according to embodiment 22, wherein a minimum capacity of the channel is equal to the maximum bandwidth of the channel when the signal-to-noise ratio equals to 1, which equals to a worst case.

A twenty-fourth embodiment is provided for a method of benchmarking interconnect performance with on-chip footprint, namely bit flow density (BFD), which is a number of bits transmitted through a certain chip width (cross-section) to reach a specific required communication length, which is highly related to a size of each device and spacing. The method comprises simulating on a processing device, a propagation speed and length for different waveguide sizes by using Lumerical MODE software, simulating on the processing device, a crosstalk leakage among waveguides under different spacing by using Lumerical FDTD and Lumerical MODE software, calculating for a specific chip length, a number of signal repeaters that a channel needs to reach the chip length based on a propagation length, calculating for a specific chip width, a number of channels that can stack into the chip width based on the device footprint and spacing, and calculating an overall bit flow density by using a total capacity of all the channels divided by the specific chip area which is the chip length by the chip width. A twenty-fifth embodiment is provided according to embodiment 24, wherein the chip length is a first side of a chip area and the chip width is a second side of the chip area opposite the first side.

A twenty-sixth embodiment is provided according to any of the prior embodiments, wherein system operation or steps of said method can be implemented by a processing device such as a chip or a computer or processor, which can be integrated with the system or separate from the system of embodiments 1-17. For instance, the processing device can be at an external system that receives the output signal from the detector. In addition, information can be stored in a storage device such as a memory, which is in communication with the processing device. With regard to the method embodiments, for instance, the system is sending a signal from a first component to a second component. The signal power must reach a certain current level that depends on the second component (size, function, etc.). The current level is based on the second component. Once the minimum current is determined, the minimum power can be determined for sending the signal to the photodetector. The laser output power should at least equal the minimum power that the photodetector needs after compensating for all the losses of the link (i.e., the actual laser output power is much higher than the minimum photodetector power). However, the power that is put into the laser should be even higher since the laser has its own efficiency value (e.g., 4W input power will have 1W of laser output power for a 25% efficient laser). This laser input power is the power value that is determined.

The following documents are cited herein, and are hereby incorporated by reference: [1] Shekar Borkar, "State-of-the-art Electronics," Session 3 Panel Talk, NSF Workshop on Emerging Technologies for Interconnects (WETI), Feb. 2-3, 2012, Washington, D.C. http://weti.cs.ohiou.edu/shekbar_weti.pdf. [2] Manuel Ujaldon, "A look ahead: Echelon," NVIDIA slides from http://gpu.cs.uct.ac.za/Slides/Echelon.pdf.

Miller, David A B. "Device requirements for optical interconnects to silicon chips." Proceedings of the IEEE 97.7 (2009): 1166-1185. [3] "International Technology Roadmap for Semiconductors (2013 edition)." Available: www.itrs.net. [5] Batten, C., Joshi, A., Orcutt, J., Khilo, A., Moss, B., & Holzwarth, C., et al. (2008). Building Manycore Processor-to-DRAM Networks with Monolithic Silicon Photonics. 2008 16th IEEE Symposium on High Performance Interconnects (Vol. 29, pp. 21-30). [6] Sun, Chen, et al. "DSENT—a tool connecting emerging photonics with electronics for opto-electronic networks-on-chip modeling." Networks on Chip (NoCS), 2012 Sixth IEEE/ACM International Symposium on. IEEE, 2012. [7] Rakheja, Shaloo, and Vachan Kumar. "Comparison of electrical, optical and plasmonic on-chip interconnects based on delay and energy considerations." Quality Electronic Design (ISQED), 2012 13th International Symposium on. IEEE, 2012. [8] Li, Guoliang, et al. "Ultralow-loss, high-density SOI optical waveguide routing for macrochip interconnects." Optics express 20.11 (2012): 12035-12039. [9] Berini, Pierre, and Israel De Leon. "Surface plasmon-polariton amplifiers and lasers." Nature Photonics 6.1 (2012): 16-24. [10] K. Liu, N. Li, D.K. Sadana, V. J. Sorger, "Integrated nano-cavity plasmon light-sources for on-chip optical interconnects." Light Science & Applications, Submitted. [11] Lau E K, Lakhani A, Tucker R S, & Wu M C. (2009). Enhanced modulation bandwidth of nanocavity light emitting devices. Optics Express, 17(10), 7790. [12] Dong, Po, Liao, Shirong, Feng, Dazeng, Liang, Hong, Zheng, Dawei, & Shafiiha, Roshanak, et al. (2009). Low vpp, ultralow-energy, compact, high-speed silicon electro-optic modulator. Opt Express, 17(25), 22484. [13] McNerney J, Farmer J D, Redner S, Trancik J E, Role of design complexity in technology improvement, Proceedings of the National Academy of Sciences, 2011, Vol. 108, pp. 9008-9013. [14] R. Hemenway, West (2013). "Roadmap for Board Level Optical Interconnects—They're Coming Sooner Than You Think!" CTR III TWG report Semicon.

[15] Gardes, F. Y., et al. "40 Gb/s silicon photonics modulator for TE and TM polarisations." Optics express 19.12 (2011): 11804-11814. [16] Thomson, David J., et al. "50-Gb/s silicon optical modulator." Photonics Technology Letters, IEEE 24.4 (2012): 234-236. [17] Zheng, Xuezhe, et al. "A high-speed, tunable silicon photonic ring modulator integrated with ultra-efficient active wavelength control." Opt. Express 22.10 (2014): 12628-12633. [18] Timurdogan, Erman, et al. "An ultralow power athermal silicon modulator." Nature communications 5 (2014). [19] Gao, Yuanda, et al. "High-Speed Electro-Optic Modulator Integrated with Graphene-Boron Nitride Heterostructure and Photonic Crystal Nanocavity." Nano letters 15.3 (2015): 2001-2005. [20] Zortman, William A., et al. "Low-power high-speed silicon microdisk modulators." Conference on Lasers and Electro-optics. Optical Society of America, 2010. [21] Zortman, William A., et al. "Low-voltage differentially-signaled modulators." Optics express 19.27 (2011): 26017-26026. [22] Watts, Michael R., et al. "Low-voltage, compact, depletion-mode, silicon Mach-Zehnder modulator." IEEE Journal of Selected Topics in Quantum Electronics 16.1 (2010): 159-164.

[23] Watts, Michael R., et al. "Ultralow power silicon microdisk modulators and switches." 5th Annual Conference on Group IV Photonics. 2008. [24] Watts, Michael R., et al. "Vertical junction silicon microdisk modulators and switches." Optics express 19.22 (2011): 21989-22003. [25] Cai, Wenshan, Justin S. White, and Mark L. Brongersma. "Compact, high-speed and power-efficient electrooptic plasmonic modulators." Nano letters 9.12 (2009): 4403-4411. [26] Dionne, Jennifer A., et al. "PlasMOStor: a metal-oxide-Si field effect plasmonic modulator." Nano Letters 9.2 (2009): 897-902. [27] Haffner, C., et al. "All-plasmonic Mach-Zehnder modulator enabling optical high-speed communication at the microscale." Nature Photonics 9.8 (2015): 525-528. [28] Lu, Zhaolin, and Wangshi Zhao. "Nanoscale electro-optic modulators based on graphene-slot waveguides." JOSA B 29.6 (2012): 1490-1496. [29] Melikyan, A., et al. "Surface plasmon polariton absorption modulator." Optics express 19.9 (2011): 8855-8869.

[30] Sorger, Volker J., et al. "Ultra-compact silicon nanophotonic modulator with broadband response." Nanophotonics 1.1 (2012): 17-22. [31] Babicheva, Viktoriia E., Radu Malureanu, and Andrei V. Lavrinenko. "Plasmonic finite-thickness metal-semiconductor-metal waveguide as ultra-compact modulator." Photonics and Nanostructures-Fundamentals and Applications 11.4 (2013): 323-334. [32] Kim, Jin Tae. "CMOS-compatible hybrid plasmonic modulator based on vanadium dioxide insulator-metal phase transition." Optics letters 39.13 (2014): 3997-4000. [33] Zhu, Shiyang, G. Q. Lo, and D. L. Kwong. "Theoretical investigation of silicon MOS-type plasmonic slot waveguide based MZI modulators." Optics express 18.26 (2010): 27802-27819. [34] Zhu, Shiyang, G. Q. Lo, and D. L. Kwong. "Phase modulation in horizontal metal-insulator-silicon-insulator-metal plasmonic waveguides." Optics express 21.7 (2013): 8320-8330. [35] Schuller, Jon A., et al. "Plasmonics for extreme light concentration and manipulation." Nature materials 9.3 (2010): 193-204.

[36] Krasavin, Alexey V., et al. "All-plasmonic modulation via stimulated emission of copropagating surface plasmon polaritons on a substrate with gain." Nano letters 11.6 (2011): 2231-2235. [37] Piao, Xianji, Sunkyu Yu, and Namkyoo Park. "Control of Fano asymmetry in plasmon induced transparency and its application to plasmonic waveguide modulator." Optics express 20.17 (2012): 18994-18999. [38] Babicheva, Viktoriia E., and Andrei V. Lavrinenko. "Plasmonic modulator optimized by patterning of active layer and tuning permittivity." Optics Communications 285.24 (2012): 5500-5507. [39] Thomas, Robert, Zoran Ikonic, and Robert W. Kelsall. "Plasmonic modulators for near-infrared photonics on a silicon-on-insulator platform." Selected Topics in Quantum Electronics, IEEE Journal of 19.3 (2013): 4601708-4601708. [40] Babicheva, Viktoriia E., et al. "Towards CMOS-compatible nanophotonics: Ultra-compact modulators using alternative plasmonic materials." Optics express 21.22 (2013): 27326-27337. [41] Shih, Min-Hsiung. "Plasmonics: Small and fast plasmonic modulator." Nature Photonics 8.3 (2014): 171-172. [42] Melikyan, A., et al. "High-speed plasmonic phase modulators." Nature Photonics 8.3 (2014): 229-233.

[43] Neira, Andres D., et al. "Ultrafast all-optical modulation with hyperbolic metamaterial integrated in Si photonic circuitry." Opt. Express 22.9 (2014): 10987-10994. [44] Babicheva, Viktoriia E., et al. "Plasmonic modulator using CMOS-compatible material platform." Advanced Electromagnetic Materials in Microwaves and Optics (METAMATERIALS), 2014 8th International Congress on. IEEE, 2014. [45] Gao, Weilu, et al. "High-contrast terahertz wave modulation by gated graphene enhanced by extraordinary transmission through ring apertures." Nano letters 14.3 (2014): 1242-1248. [46] Ye, Chenran, et al. "λ-size ITO and graphene-based electro-optic modulators on SOI." Selected Topics in Quantum Electronics, IEEE Journal of 20.4 (2014): 40-49. [47] Krasavin, A. V., and A. V. Zayats. "Photonic signal processing on electronic scales: electro-optical field-effect nanoplasmonic modulator." Physical review letters 109.5 (2012): 053901. [48] Vivien, Laurent, et al. "42 GHz pin Germanium photodetector integrated in a silicon-on-insulator waveguide." Optics express 17.8 (2009): 6252-6257.

[49] Zhang, Yongzhe, et al. "Broadband high photoresponse from pure monolayer graphene photodetector." Nature communications 4 (2013): 1811. [50] Beling, Andreas, et al. "Miniaturized waveguide-integrated pin photodetector with 120-GHz bandwidth and high responsivity." Photonics Technology Letters, IEEE 17.10 (2005): 2152-2154. [51] Kato, Kazutoshi, et al. "A high-efficiency 50 GHz InGaAs multimode waveguide photodetector." Quantum Electronics, IEEE Journal of 28.12 (1992): 2728-2735. [52] Engel, Michael, Mathias Steiner, and Phaedon Avouris. "Black phosphorus photodetector for multispectral, high-resolution imaging." Nano letters 14.11 (2014): 6414-6417. [53] Hu, Linfeng, et al. "An Optimized Ultraviolet-A Light Photodetector with Wide-Range Photoresponse Based on ZnS/ZnO Biaxial Nanobelt." Advanced Materials 24.17 (2012): 2305-2309. [54] Pospischil, Andreas, et al. "CMOS-compatible graphene photodetector covering all optical communication bands." Nature Photonics 7.11 (2013): 892-896.

[55] Fang, Zheyu, et al. "Graphene-antenna sandwich photodetector." Nano letters 12.7 (2012): 3808-3813. [56] Furchi, Marco, et al. "Microcavity-integrated graphene photodetector." Nano letters 12.6 (2012): 2773-2777. [57] Xia, Fengnian, et al. "Ultrafast graphene photodetector." Nature nanotechnology 4.12 (2009): 839-843. [58] Vivien, Laurent, et al. "Zero-bias 40 Gbit/s germanium waveguide photodetector on silicon." Optics express 20.2 (2012): 1096-1101. [59] Fan, Pengyu, et al. "An invisible metal-semiconductor photodetector." Nature Photonics 6.6 (2012): 380-385. [60] Kim, Jin Tae, et al. "Graphene-based plasmonic photodetector for photonic integrated circuits." Optics express 22.1 (2014): 803-808. [61] Shackleford, James A., et al. "Integrated plasmonic lens photodetector." Applied Physics Letters 94.8 (2009): 083501. [62] Wu, Wei, Alireza Bonakdar, and Hooman Mohseni. "Plasmonic enhanced quantum well infrared photodetector with high detectivity." Applied physics letters 96.16 (2010): 161107.

[63] Yu, E. T., et al. "Plasmonic nanoparticle scattering for enhanced performance of photovoltaic and photodetector devices." NanoScience+Engineering. International Society for Optics and Photonics, 2008. [64] Mousavi, Saba Siadat, Andreas Stohr, and Pierre Berini. "Plasmonic photodetector with terahertz electrical bandwidth." Applied Physics Letters 104.14 (2014): 143112. [65] Littlejohns, Callum G., et al. "50 Gb/s silicon photonics receiver with low insertion loss." Photonics Technology Letters, IEEE 26.7 (2014): 714-717. [66] Gan, Xuetao, et al. "Chip-integrated ultrafast graphene photodetector with high responsivity." Nature Photonics 7.11 (2013): 883-887. [67] Casalino, M., et al. "Asymmetric MSM sub-bandgap all-silicon photodetector with low dark current." Optics express 21.23 (2013): 28072-28082. [68] Li, Xianyao, et al. "40 Gb/s All-Silicon Photodetector Based on Microring Resonators." Photonics Technology Letters, IEEE 27.7 (2015): 729-732. [69] Duan, Ning, et al. "310 GHz gain-bandwidth product Ge/Si avalanche photodetector for 1550 nm light detection." Optics express 20.10 (2012): 11031-11036.

[70] Novack, Ari, et al. "Germanium photodetector with 60 GHz bandwidth using inductive gain peaking." Optics express 21.23 (2013): 28387-28393. [71] Feng, Dazeng, et al. "High-speed Ge photodetector monolithically integrated with large cross-section silicon-on-insulator waveguide."

Applied Physics Letters 95.26 (2009): 261105. [72] Liu, Yuan, et al. "Plasmon resonance enhanced multicolour photodetection by graphene." Nature communications 2 (2011): 579. [73] Chen, G., Chen, H., Haurylau, M., Nicholas A. Nelson, David H. Albonesi, & Philippe M. Fauchet, et al. (2007). Predictions of cmos compatible on-chip optical interconnect. Integration the Vlsi Journal, 40(4), 434-446. [74] Koos, Christian, et al. "Silicon-Organic Hybrid (SOH) and Plasmonic-Organic Hybrid (POH) Integration." Optical Fiber Communication Conference. Optical Society of America, 2015. [75] Alain J. Martin, Mika Nystrom, & Paul I. Pénzes. (2002). Et2: a metric for time and energy efficiency of computation. Series in Computer Science, 293-315. [76] Laros III, J. H., Pedretti, K., Kelly, S. M., Wei, S., Ferreira, K., & Vandyke, J., et al. (2013). Energy delay product. Springerbriefs in Computer Science, 51-55. [77] Song, Weiwei, et al. "High-density waveguide superlattices with low crosstalk." Nature communications 6 (2015). [78] Ma, Ren-Min, et al. "Room-temperature sub-diffraction-limited plasmon laser by total internal reflection." Nature materials 10.2 (2011): 110-113.

The foregoing description and drawings should be considered as illustrative only of the principles of the invention. The invention may be configured in a variety of shapes and sizes and is not intended to be limited by the preferred embodiment. Numerous applications of the invention will readily occur to those skilled in the art. Therefore, it is not desired to limit the invention to the specific examples disclosed or the exact construction and operation shown and described. Rather, all suitable modifications and equivalents may be resorted to, falling within the scope of the invention.

The invention claimed is:

1. An intrinsic hybrid photonic plasmonic system, comprising:
    a plasmonic laser configured to generate an optical signal;
    a photonic waveguide configured to propagate the optical signal; and
    a plasmonic detector configured to detect the optical signal.
2. The system of claim 1, wherein said photonic waveguide is diffraction-limited.
3. The system of claim 1, further comprising an electronic driver configured to turn said plasmonic laser ON and OFF to modulate the optical signal from said plasmonic laser to load electronic data to provide a modulated optical signal, and said plasmonic detector is configured to detect the modulated optical signal.
4. The system of claim 1, further comprising a plasmonic laser configured to provide the optical signal and to turn ON and OFF to add electronic data to the optical signal to provide a modulated optical signal, and said photonic detector is configured to detect the modulated optical signal.
5. The system of claim 1, wherein the optical signal has a wavelength of 1550 nm.
6. The system of claim 1, wherein the optical signal has a wavelength and said waveguide is near-transparent for the wavelength.
7. The system of claim 6, wherein the waveguide is low loss for the wavelength.
8. The system of claim 1, wherein the total energy cost includes the laser pumping energy, the electrical laser driver energy and the photodetector bias energy and the laser pumping energy compensates all the channel losses.
9. The system of claim 8, wherein the channel losses include waveguide loss, laser efficiency, crosstalk and photodetector responsivity.
10. The system of claim 1, said system having a point-to-point latency is less than 100 ps/cm, an energy per bit is about or below 15 fJ/bit, a transmission loss less than 1.1 dB/cm, a bit flow density of 0.01~1 Gbps/µm2, and a cross-section of 2 µm2.
11. An extrinsic hybrid photonic plasmonic system, comprising:
    a plasmonic laser configured to generate light;
    a photonic waveguide configured to propagate an optical signal; and
    a plasmonic modulator configured to manipulate the optical signal to load electronic data into the optical signal, to provide a modulated optical signal; and
    a plasmonic detector configured to detect the modulated optical signal.
12. The system of claim 11, further comprising a plasmonic laser configured to provide the optical signal to said photonic waveguide.
13. The system of claim 11, further comprising a photonic modulated signal waveguide configured to propagate the modulated optical signal from said plasmonic modulator to said plasmonic detector with plasmonic-photonic coupler.
14. The system of claim 11, wherein the optical signal has a wavelength of 1550 nm.
15. The system of claim 11, wherein the optical signal has a wavelength and said waveguide is near-transparent (low loss) for the wavelength.
16. The system of claim 11, wherein the total energy cost includes the laser pumping energy, the electrical modulator driver energy, the modulator energy, and the photodetector bias energy and the laser pumping energy compensates all the channel losses, which includes waveguide loss, coupler loss, laser efficiency, crosstalk and photodetector responsivity.
17. The system of claim 11, said system having a point-to-point latency is less than 100 ps/cm, an energy per bit is about or below 25 fJ/bit, a transmission loss less than 2.1 dB/cm, a bit flow density of 0.01~1 Gbps/µm2, and a cross-section of 2 µm2.
18. A method for calculating a laser power for photonic, plasmonic and hybrid photonic plasmonic data interconnect systems having a laser, photodetector and a link comprising a waveguide, the method comprising:
    providing the minimum current that is required by a next stage to which the link is connected;
    determining at the photodetector, a minimum light power that is required by the photodetector to generate the minimum current;
    determining at the laser, a minimum laser output power to compensate a channel loss of the waveguide, modulator, coupler and waveguide crosstalk losses; and
    determining at the laser, the laser power based on laser efficiency.
19. The method of claim 18, further comprising predicting at the processing device, a laser energy efficiency in the unit of J/bit based on different cavities of the laser and coding schemes for the intrinsic system of claim 1.
20. The method of claim 19, wherein different laser cavities give laser different power efficiency at under different scaling and the coding schemes affect the coding efficiency, which further affect the energy that a laser needs to send a bit of data.
21. The method of claim 18, further comprising predicting at the processing device, a required laser energy for different device cavities and photonic waveguides for the extrinsic system of claim 11.

22. A method for predicting the capacity of an entire channel of a waveguide, the method comprising:
- calculating a maximum bandwidth of the channel in hertz based on a lowest bandwidth device on the channel; and
- calculating a channel capacity of the channel in bits per second by using the maximum bandwidth and a signal-to-noise ratio (SNR) of the channel, wherein the channel capacity equals to bandwidth×log 2(1+SNR).

23. The method of claim 22, wherein a minimum capacity of the channel is equal to the maximum bandwidth of the channel when the signal-to-noise ratio equals to 1, which equals to a worst case.

24. A method of benchmarking interconnect performance with on-chip footprint, namely bit flow density (BFD), which is a number of bits transmitted through a certain chip width (cross-section) to reach a specific required communication length, which is highly related to a size of each device and spacing, the method comprising:
- simulating on a processing device, a propagation speed and length for different waveguide sizes;
- simulating on the processing device, a crosstalk leakage among waveguides under different spacing;
- calculating for a specific chip length, a number of signal repeaters that a channel needs to reach the chip length based on a propagation length;
- calculating for a specific chip width, a number of channels that can stack into the chip width based on the device footprint and spacing; and
- calculating an overall bit flow density by using a total capacity of all the channels divided by the specific chip area which is the chip length by the chip width.

25. The method of claim 24, wherein the chip length is a first side of a chip area and the chip width is a second side of the chip area opposite the first side.

* * * * *